(12) United States Patent
Momose

(10) Patent No.: US 7,722,407 B2
(45) Date of Patent: May 25, 2010

(54) COMPOSITE CONNECTOR AND ELECTRONIC APPARATUS THEREOF

(75) Inventor: Hideaki Momose, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/397,953

(22) Filed: Mar. 4, 2009

(65) Prior Publication Data

US 2009/0227147 A1 Sep. 10, 2009

(30) Foreign Application Priority Data

Mar. 5, 2008 (JP) .............................. 2008-055464

(51) Int. Cl.
*H01R 33/00* (2006.01)
(52) U.S. Cl. ...................................... 439/638; 439/108
(58) Field of Classification Search ................. 439/638, 439/108, 941
See application file for complete search history.

(56) References Cited

U.S. PATENT DOCUMENTS 6,280,209 B1 * 8/2001 Bassler et al. ............... 439/101
6,863,549 B2 * 3/2005 Brunker et al. .............. 439/108
7,591,683 B2 * 9/2009 Zhang et al. ................ 439/638
2002/0123254 A1 * 9/2002 Kato et al. .................. 439/108
2004/0180577 A1 * 9/2004 Zhang ........................ 439/607
2007/0049119 A1 3/2007 Fujimoto et al.
2009/0124125 A1 * 5/2009 Chatterjee .............. 439/607.05

FOREIGN PATENT DOCUMENTS

JP 2007-059351 A 3/2007

* cited by examiner

*Primary Examiner*—Michael C Zarroli
(74) *Attorney, Agent, or Firm*—Canon U.S.A., Inc. I.P. Division

(57) ABSTRACT

An electronic apparatus includes a composite connector including a plurality of digital signal terminals and a plurality of analog signal terminals, the plurality of digital signal terminals including at least a pair of differential signal terminals; and a wiring board on which the plurality of digital signal terminals and the plurality of analog signal terminals are arranged. The plurality of analog signal terminals and the plurality of digital signal terminals are arranged and disposed in line on the wiring board. The plurality of analog signal terminals are not disposed between the pair of differential signal terminals. The plurality of analog signal terminals are disposed between the plurality of digital signal terminals other than the pair of differential signal terminals.

20 Claims, 13 Drawing Sheets

COMPOSITE CONNECTOR AND ELECTRONIC APPARATUS THEREOF

BACKGROUND OF THE INVENTION

1. Field of the Invention

The present invention relates to a composite connector to which a digital signal or an analog signal is transmitted, and to an electronic apparatus including the composite connector.

2. Description of the Related Art

An electronic apparatus is provided with a universal serial bus (USB) connector for communication with a personal computer (PC). An A connector at a PC side (corresponding to a host) and a B connector at an apparatus side are connected to each other with a USB cable, to exchange data. In a small portable electronic apparatus, such as a digital camera or a video camera, a mini-B connector is mounted and used for exchanging photographed images or for exchanging data when directly operating the portable electronic apparatus using the PC. When one wants to print out the photographed images, the portable electronic apparatus is directly connected to a printer. When peripheral devices are connected to each other, a mini-A connector, which is a downsized version of the A connector, may be used. USB signal lines include signal lines D+ and D− and power supply lines VBUS and GND. The signal lines are used to transmit differential signals. Two signal lines are provided for transmitting one signal, to transmit the signal on the basis of a potential difference thereof. In addition, a signal line including an ID signal used in a USB On-The-Go Standard is available. Here, the USB On-The-Go Standard makes it possible to transfer data as a result of directly connecting electronic apparatuses to each other using a USB cable instead of connecting them through the PC.

As an image output terminal, an AV terminal is mounted to a digital camera or a video camera. An AV cable is connected to a monitor or an audio device to output an image or a sound.

Since, for example, the shape of a USB cable plug differs from the shape of an AV cable plug, receptacle connectors are disposed in correspondence with the respective plugs in the apparatus. However, the volume occupied by the USB connector and an AV connector in the apparatus is large. This is a serious hindrance to reducing the size of the electronic apparatus. Accordingly, a technology which makes it possible to insert the mini-A connector and the mini-B connector into one connector is disclosed in Japanese Patent Laid-Open No. 2007-59351.

Data transfer speed of the USB tends to increase. USB2.0 has Hi-speed, Full-speed, and Low-speed communication modes. In the Hi-speed communication mode, high-speed communication is performed at 480 Mbps. A characteristic impedance required of a USB transmission path is equal to a differential impedance of $90\Omega\pm15\%$. It is necessary to perform impedance control on a pair of D+ and D− signals (which are USB differential signals). Various considerations need to be made for maintaining communication, such as making the lengths of wires equal to each other for ensuring the quality of signals, and adjusting the widths and thicknesses of the wires so that the impedance is set at a prescribed value.

The high-speed differential signals generate radiation noise as a result of moving in a board, a connector, or a cable. The noise generated from a circuit in another apparatus may be transmitted along the USB cable or the AV cable and radiated to the outside. Therefore, the influence of radiation noise on other apparatuses is becoming a problem. To overcome this problem, a common mode choke coil is inserted in the USB differential signals or a bead is inserted in audio and video signal lines.

However, when a connector in which two types of plugs can be inserted is used, different signal lines for USB signals and AV signals are mixed, thereby making it difficult to overcome radiation noise and to maintain the quality of the signals.

FIG. 14 is a rear perspective view of a conventional connector. Reference numeral 400 denotes a connector in which two types of plugs can be inserted. Terminals are drawn out for mounting the connector 400 to a wiring board from the rear side of the connector. In FIG. 14, USB signals move at the upper side; and other signals, such as AV signals, move at the lower side. USB signal lines are drawn out straight, and lower AV signal lines are bent toward both sides and drawn out. An arrangement of pins at the upper USB side is prescribed on the basis of a USB standard. Reference numeral 401 denotes USB signal terminals, reference numeral 402 denotes a USB GND terminal (USB ground terminal), reference numeral 403 denotes an ID terminal, reference numeral 404 denotes a D+ terminal, reference numeral 405 denotes a D− terminal, and reference numeral 406 denotes a Vbus terminal. Reference numeral 407 denotes AV terminals, which are disposed at respective sides of the USB signal terminals 401. Since the AV terminals are separated at the respective sides, they need to be disposed on respective sides of the USB differential signals.

In FIG. 15 showing another conventional example, USB terminals 401 are disposed at the upper side, and AV terminals 407 are disposed at the lower side. These terminals are substantially alternately drawn out. In this case, the AV terminals 407 are disposed between a USB differential signal terminal D+ 404 and a differential signal terminal D− 405 on a wiring board. This may influence signals thereof. Japanese Patent Laid-Open No. 2007-59351 does not discuss the quality of the signals and noise.

SUMMARY OF THE INVENTION

According to an aspect of the present invention, an electronic apparatus includes a composite connector including a plurality of digital signal terminals and a plurality of analog signal terminals, the plurality of digital signal terminals including at least a pair of differential signal terminals. The electronic apparatus also includes a wiring board on which the plurality of digital signal terminals and the plurality of analog signal terminals are arranged. The plurality of analog signal terminals and the plurality of digital signal terminals are arranged and disposed in line on the wiring board. The plurality of analog signal terminals are not disposed between the pair of differential signal terminals. The plurality of analog signal terminals are disposed between the plurality of digital signal terminals other than the pair of differential signal terminals.

Further features of the present invention will become apparent from the following description of exemplary embodiments with reference to the attached drawings.

DESCRIPTION OF THE EMBODIMENTS

Various embodiments of the present invention will hereunder be described with reference to the drawings. In the following description and the various figures, except where noted otherwise, each instance of a reference mark refers to the same item.

A first embodiment of the present invention is applied to a digital camera. However, it may alternatively be applied, for example, to an apparatus including a composite connector, such as a USB connector or an AV connector of a video camera or a cellular phone, that performs a plurality of output operations to the outside.

Figure 1:
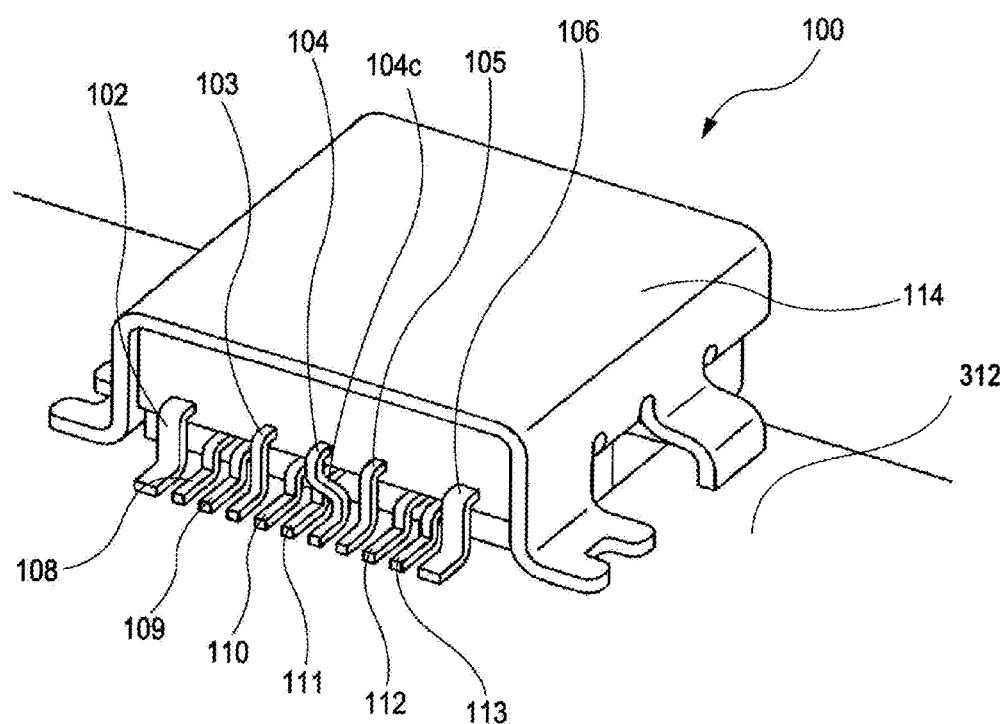
FIG. 1 is a rear perspective view of a receptacle connector according to a first embodiment of the present invention.

FIG. 1 shows a receptacle connector according to the first embodiment of the present invention. The receptacle connector will be described in detail in the embodiment of the present invention with reference to FIG. 2 and the figures that follow.

Figure 11:
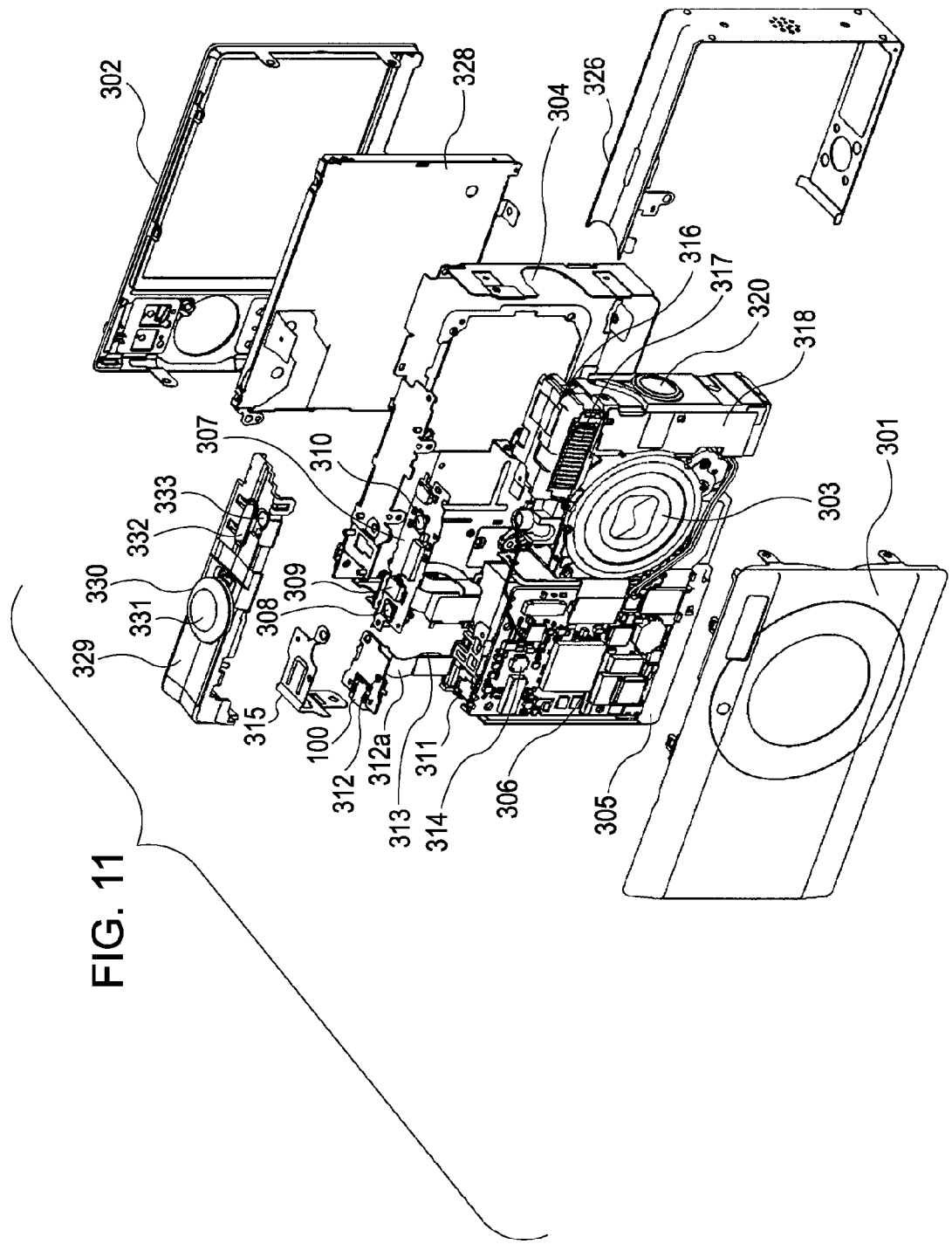
FIG. 11 is a front perspective view of a digital camera.
Figure 12:
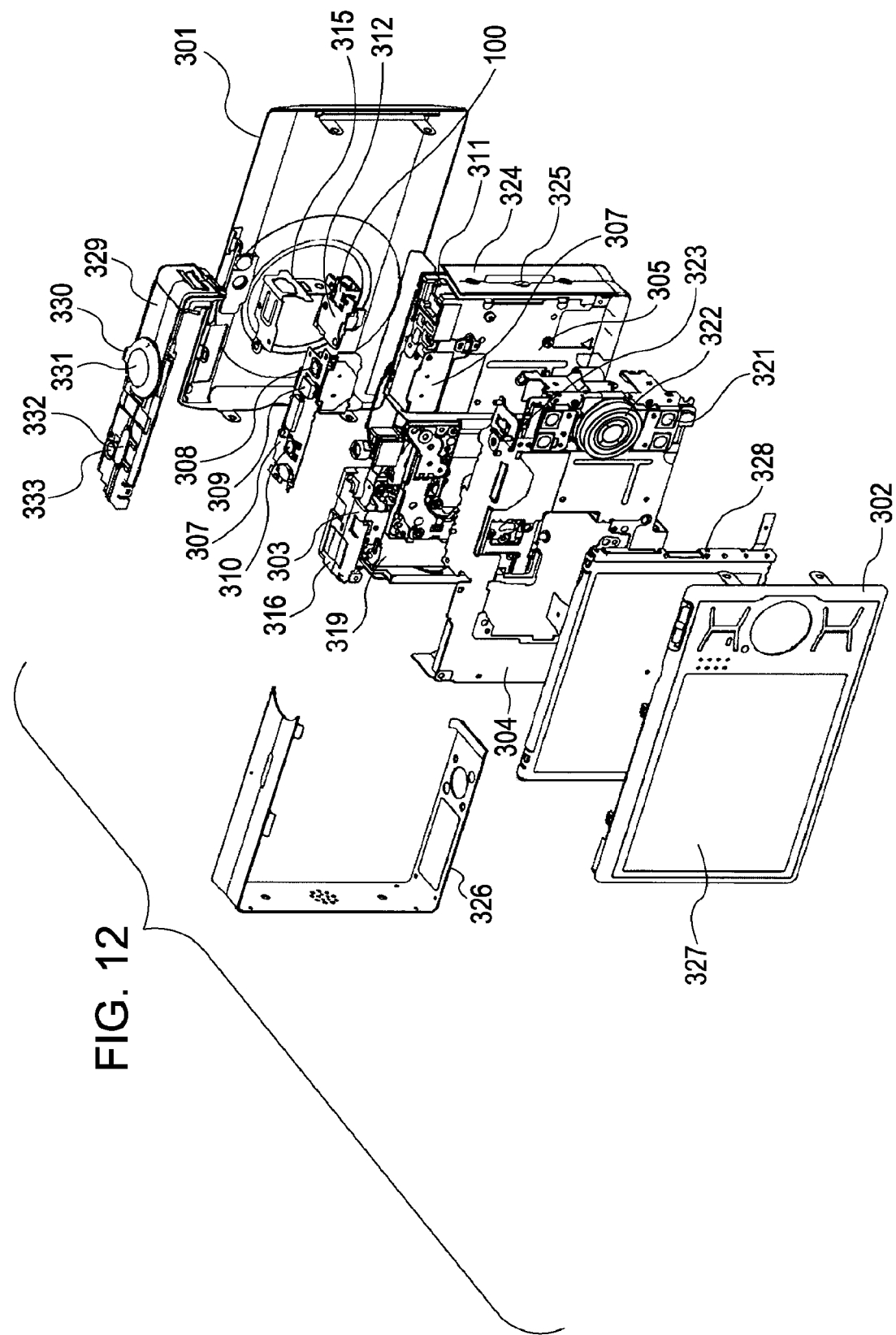
FIG. 12 is a rear perspective view of the digital camera.

First, the structure of the digital camera to which the embodiment is applied will be described. FIG. 11 is a front perspective view of the digital camera. FIG. 12 is a rear perspective view of the digital camera. Reference numeral 301 denotes a front cover that covers the front side of the digital camera. Reference numeral 302 denotes a rear cover that covers the rear side of the digital camera. Reference numeral 303 denotes a lens barrel unit that holds, for example, a taking lens. The lens barrel unit 303 is secured to a metallic chassis 304 with, for example, a lens-barrel securing screw (not shown).

Reference numeral 305 denotes a battery case for holding a battery. The battery case 305 is secured to the metallic chassis 304 with a battery-case securing screw. For example, a CPU, a memory, an image processing IC, and a power-supply circuit are mounted to a main wiring board 306. A slot of a memory card, which is an external memory that stores an image or sound, is provided at the rear surface of the main wiring board 306. The main wiring board 306 is secured to the metallic chassis 304 with a main-wiring-board securing screw. A release switch 308, a zoom switch 309, a power-supply tact switch 310, and a power-supply connector (not shown) are mounted to a battery-case-305 side of an upper flexible wiring board 307 connected to the main wiring board 306 with a connector. A recess 311 is provided at a lower portion of the battery case 305, and accommodates a memory card and a battery (not shown).

Reference numeral 100 denotes the receptacle connector to which both a USB cable and an AV cable can be fitted. The receptacle connector 100 is mounted to a jack flexible wiring board 312. The receptacle connector 100 is connected to the main wiring board 306 with connectors 313 and 314. The connector 313 is disposed between the boards so as to be situated on the jack flexible wiring board. The connector 314 is disposed between the boards so as to be situated on the main wiring board 306. The receptacle connector 100 is provided so as to be fitted to the recess 311 in the top portion of the battery case 305. In addition, the receptacle connector 100 is held down by a receptacle-connector securing plate 315 from thereabove. The receptacle-connector securing plate 315 is secured to the metallic chassis 304. In addition, the receptacle-connector securing plate 315 is a metallic plate, and is brought into contact with the metallic chassis 304 by bringing it into contact with the receptacle connector 100. When static electricity is applied to the receptacle connector 100, this makes it possible to cause the static electricity to move down to the metallic chassis 304 before moving to the main wiring board 306. Therefore, the receptacle connector 100 becomes highly resistant to the static electricity. Further, since the receptacle connector 100 fitted to the recess 311 is further pressed by the receptacle-connector securing plate 315, the receptacle connector 100 becomes highly resistant to static pressure when a plug is inserted or removed or forcefully screwed in.

Reference numeral 316 denotes a stroboscopic unit, and reference numeral 317 denotes a stroboscopic light-emitting unit. A stroboscopic flexible wiring board 318, to which a stroboscopic circuit is mounted, is attached to a downwardly extending frame portion of the stroboscopic light-emitting unit 317. In addition, a stroboscopic capacitor 319 is secured to the downwardly extending frame portion of the stroboscopic light-emitting unit 317. Reference numeral 320 denotes a speaker. A speaker signal is input when a speaker cable is soldered to a copper foil exposure portion of the stroboscopic flexible wiring board 318.

Reference numeral 321 denotes a rear-surface operation button. Reference numeral 322 denotes a rotating cross button unit including a rotating mechanism and buttons disposed in the form of a cross below the rotating mechanism. Reference numeral 323 denotes a changing-over lever for changing an operation mode of the camera. Moving the changing-over lever 323 towards the left and right changes the operation mode to a still image shooting mode, a video shooting mode, or an image reproduction mode. Reference numeral 324 denotes a side cover a. The side cover a324 covers the side surfaces of the camera, and is secured, along with a strap ring 325 (through which a strap string is passed), to the metallic chassis 304.

Reference numeral 326 denotes a side cover b that covers the top surface, a side surface, and the bottom surface of the camera. Reference numeral 327 denotes a rear window that covers a liquid crystal panel 328. Reference numeral 329 denotes an upper cover, which holds a zoom lever 330, a release button 331, a power-supply button 332, and a microphone 333.

Figure 2:
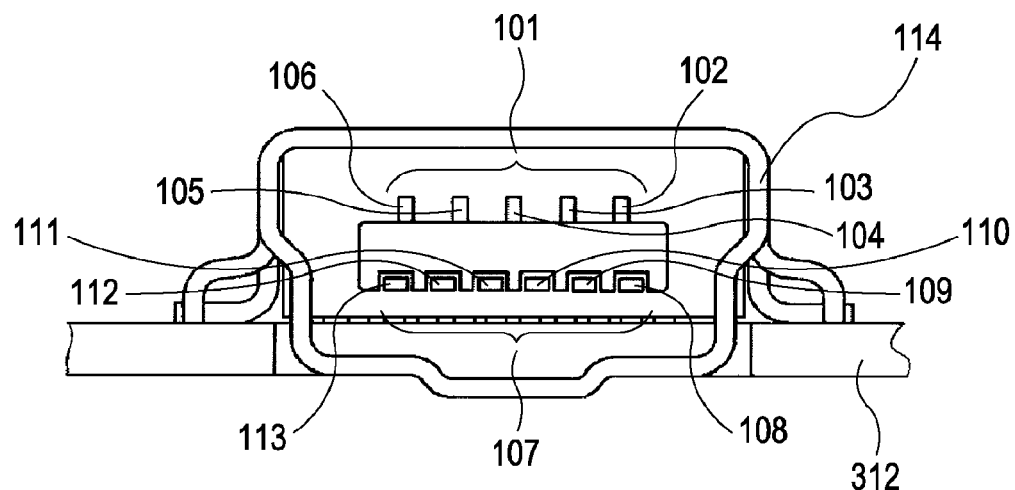
FIG. 2 is a front view of the receptacle connector according to the first embodiment of the present invention.
Figure 3:
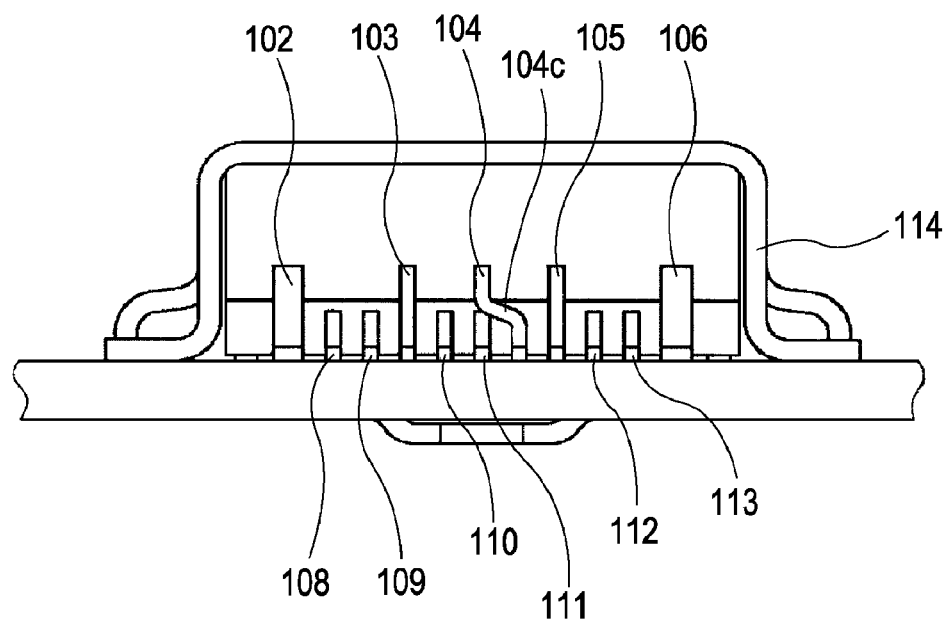
FIG. 3 is a rear view of the receptacle connector according to the first embodiment of the present invention.
Figure 4:
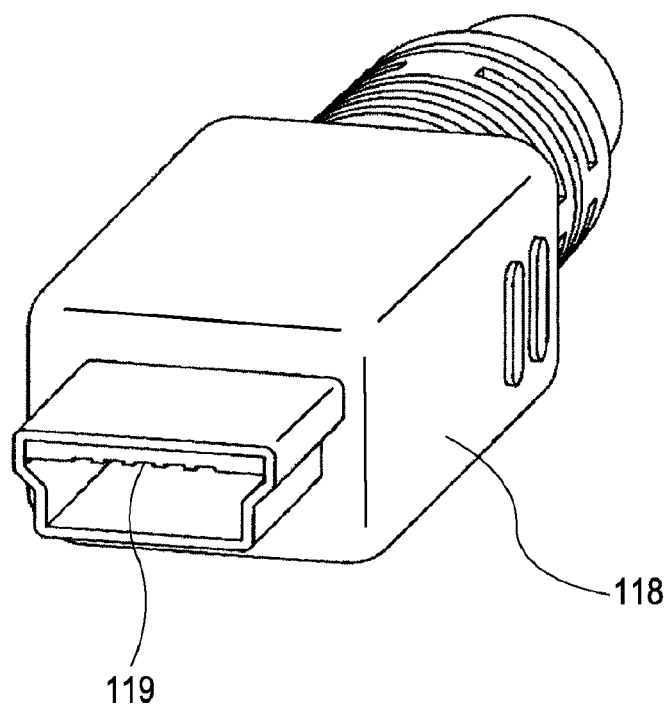
FIG. 4 is a front perspective view of a USB plug.
Figure 5:
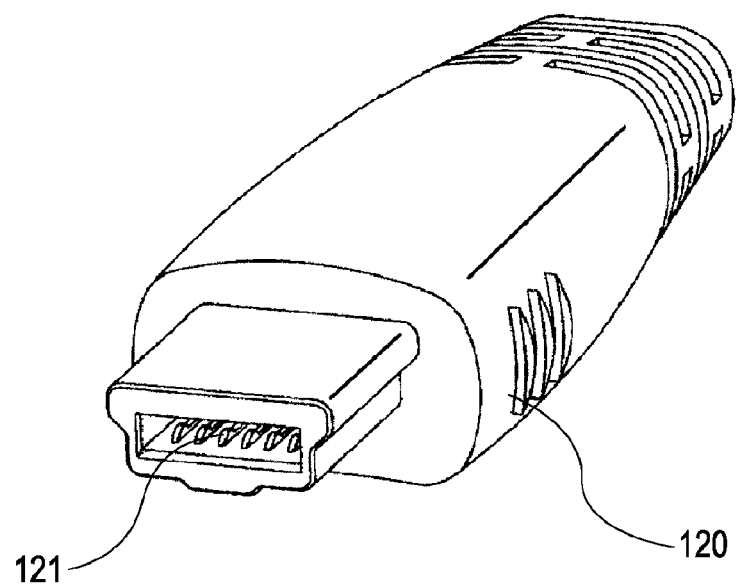
FIG. 5 is a front perspective view of an AV plug.

The receptacle connector used in the present invention will hereunder be described in more detail. FIG. 1 is a rear perspective view of the receptacle connector according to the embodiment of the present invention. FIG. 2 is a front view thereof. FIG. 3 is a rear view thereof. FIG. 4 is a front perspective view of a USB plug that is connected to the receptacle connector. FIG. 5 is a front perspective view of an AV plug.

Reference numeral 100 denotes the receptacle connector. Reference numeral 101 denotes a USB terminal group (digital signal terminal group) connected to a USB. Reference numeral 102 denotes a USB GND terminal (USB ground terminal). Reference numeral 103 denotes an ID terminal. Reference numeral 104 denotes a D+ terminal. Reference numeral 105 denotes a D− terminal. Reference numeral 106 denotes a Vbus terminal. The arrangement of these pins is prescribed on the basis of a USB standard. The terminal group 101, which is connected to the USB, is positioned at an illustrated upper side of the receptacle connector. When the terminal group 101 is inserted into a USB plug 118, the terminal group 101 comes into contact with a USB plug terminal group 119 in the USB plug 118, to perform communication. Reference numeral 107 denotes an AV terminal group (analog signal terminal group) that is connected to an AV plug 120. Reference numeral 108 denotes an image/sound standard GND terminal (image/sound standard ground terminal). Reference numeral 109 denotes an image signal terminal. Reference numeral 110 denotes a left sound signal terminal. Reference numeral 111 denotes a right sound signal terminal. Reference numeral 112 denotes a shell GND terminal (shell ground terminal) that is connected to a receptacle-connector metallic shell 114. Reference numeral 113 denotes a plug-insertion detection terminal. The AV terminal group 107 connected to the AV plug 120 is positioned at the illustrated lower side of the receptacle connector 100. When the AV plug 120 is inserted into the AV terminal group 107, the AV terminal group 107 comes into contact with an AV plug terminal group 121 in the AV plug 120, so that an image signal and a sound signal are output to the outside. Reference numeral 312 denotes the wiring board. The plurality of analog signal terminals and the plurality of digital signal terminals are arranged and disposed in one row on the wiring board 312.

Figure 6:
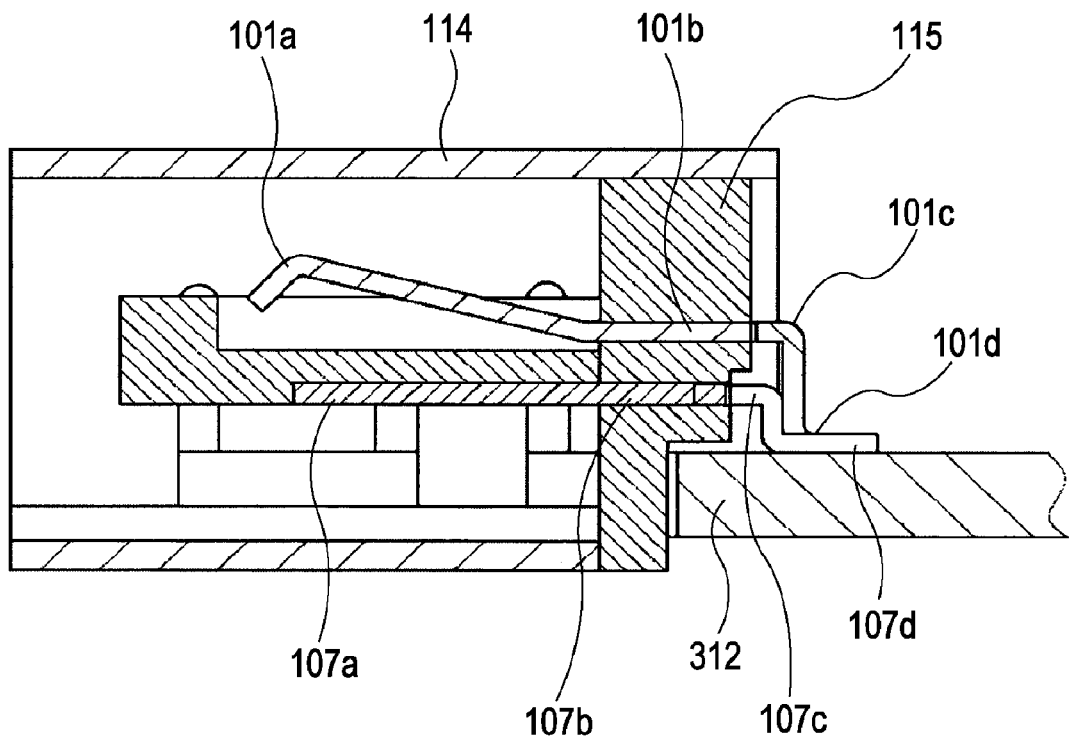
FIG. 6 is a sectional view of the receptacle connector according to the first embodiment of the present invention.

FIG. 6 is a sectional view of the receptacle connector 100. Reference numeral 114 denotes the receptacle-connector metallic shell. Reference numeral 115 denotes a terminal holding member. Reference numeral 312 denotes the jack flexible wiring board (composite-connector wiring board). The receptacle connector 100 is mounted to the wiring board so as to be disposed in the wiring board. This makes it possible to achieve size reduction because, when the receptacle connector 100 is assembled to an electronic apparatus, the resulting structure is not thick. A contact portion 101*a* of the USB terminal group 101 contacts the USB plug terminal group 119. The USB terminal group 101 is pressed against the USB plug terminal group 119 by springiness thereof, to reliably contact the USB plug terminal group 119. At a securing portion 101*b*, the USB terminal group 101 is secured by the terminal holding member 115. The USB terminal group 101 is drawn out from the rear side of the receptacle connector 100. At a USB terminal group draw-out portion 101*c* drawn out to the rear side of the receptacle connector 100, the USB terminal group 101 is bent towards the jack flexible wiring board 312. A mounting portion 101*d* of the USB terminal group 101 is mounted to each of the plurality of digital signal terminals of the wiring board 312. At the mounting portion 101*d*, the terminals of the USB terminal group 101 are disposed in one row on the wiring board 312.

A contact portion 107*a* of the AV terminal group 107 contacts the AV plug terminal group. A securing portion 107*b* of the AV terminal group 107 is secured to the terminal holding member 115. The AV terminal group 107 is drawn out towards the rear side of the receptacle connector 100. At an AV terminal group draw-out portion 107*c* drawn out to the rear side of the receptacle connector 100, the AV terminal group 107 is bent towards the jack flexible wiring board 312. A mounting portion 107*d* of the AV terminal group 107 is mounted to each of the plurality of analog signal terminals of the wiring board 312. At a mounting portion 107*d*, the terminals of the AV terminal group 107 are disposed in one row on the wiring board 312.

The perspective rear view of the receptacle connector in FIG. 1 will be described. The USB terminal group 101 and the AV terminal group 107 are drawn out in two layers (the illustrated upper side and lower side, respectively). The USB terminal group draw-out portion 101*c* and the AV terminal group draw-out portion 107*c* are bent to set the terminal groups 101 and 107 on a mounting surface. The way in which they are bent determines the arrangement of the USB terminal group 101 and the AV terminal group 107, and the arrangement of the pins of the receptacle connector 100.

The differential signals of the D+ terminal 104 (first digital signal terminal) and the D− terminal 105 (second digital signal terminal) are plus and minus differential signals. Therefore, a pair of wires is required. Consequently, at a draw-out portion 104*c*, the D+ terminal 104 is bent towards the D− terminal 105. In addition, the D− terminal 105 is disposed adjacent to the D+ terminal 104 in the arrangement of the pins of the receptacle connector 100. When the terminals of the USB terminal group 101 and those of the AV terminal group 107 are alternately disposed in straight lines, the right sound signal terminal 111, which provides an AV signal, is disposed between the D+ terminal 104 and the D− terminal 105. However, by exchanging the positions of the D+ terminal 104 and the right sound signal terminal 111 at the draw-out portion 104*c* of the rear side of the receptacle connector, the D+ terminal 104 and the D− terminal 105 can be disposed in parallel in a row on the wiring board. In addition, it is possible to reduce the influence of the differential signals on the AV signals, and to restrict a reduction in the quality of the signals occurring when the AV signals are disposed between the D+ terminal 104 and the D− terminal 105. That is, the terminals are arranged in parallel so as not to dispose the analog signal terminals between the pair of differential signal terminals, and so that the analog signal terminals are disposed between a plurality of digital signal terminals other than the pair of differential signal terminals.

Vbus in the USB standard is a power supply. The amount of electrical current flowing through the Vbus terminal 106 through which power is applied is larger than that of the terminals for other signals. Therefore, the width of the Vbus terminal 106 is large. Since the USB GND terminal 102 is a return GND, it is desirable that the USB GND terminal 102 be made similarly thick. When they are mounted, soldering is performed on the thick terminals, so that they are stronger than thin terminals. By disposing these thick terminals at the outermost side of the receptacle connector 100, the mounting strength of the connector itself is increased. Even if a load is applied to the connector when inserting or removing a plug, the connector is supported by the thick terminals at the outer side, so that it is not easily peeled off. In addition, since the GND is thick, it is possible to reduce impedance, and to restrict radiation noise.

The image signal terminal 109, in which an image output signal moves, the left sound signal terminal 110, and the right sound signal terminal 111 are disposed on only one side of the differential-signal D+ terminal 104 and the differential-signal D− terminal 105. Therefore, the AV signals do not need to be provided between the differential signals on the board, thereby making it possible to restrict a reduction in the quality of the differential signals and the influence of the differential signals on the AV signals. The USB ID terminal 103 is disposed between the image signal terminal 109 and the left sound signal terminal 110 among the image signal terminal 109, the left sound signal terminal 110, and the right sound signal terminal 111. The left sound signal terminal 110 and the right sound signal terminal 111 are disposed adjacent to each other. When the electronic apparatus provides a stereo output, this makes it easier to wire the left sound signal line and the right sound signal line in parallel on the wiring board. Further, rather than completely separately drawing out the terminals of the USB terminal group 101 and the AV terminal group 107, they are alternately disposed, with signal lines that do not influence the quality of the signals being disposed therebetween. Therefore, it is possible to reduce the size of the connector.

Figure 7:
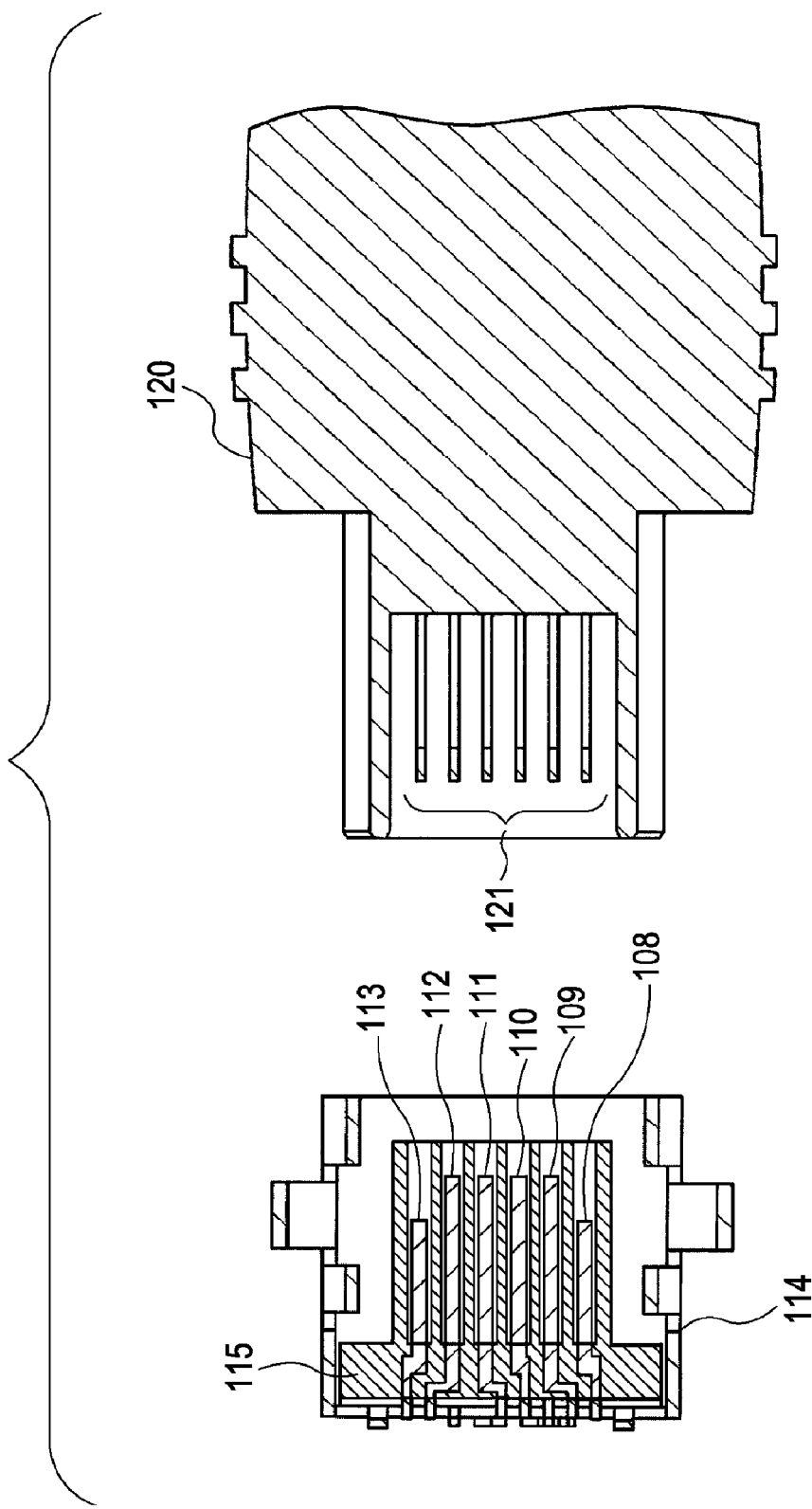
FIG. 7 is a sectional view of an AV terminal group of the receptacle connector and an AV plug.

FIG. 7 is a sectional view of the AV terminal group 107 of the receptacle connector 100 and the AV plug 120. The insertion of the plug is detected by the plug-insertion detection terminal 113 and the image/sound standard GND terminal 108. The signal line of the plug-insertion detection terminal 113 is connected to a system controlling unit of the main wiring board 306. A plug-side terminal of the plug-insertion detection terminal 113 and that of the image/sound standard GND terminal 108 are connected to each other. When the plug is inserted, the plug-insertion detection terminal 113 and the image/sound standard GND terminal 108 are electrically connected to each other, so that the plug-insertion detection terminal 113 moves down to the image/sound standard GND terminal 108. This causes the system controlling unit to recognize that the plug has been inserted. To detect the insertion, two pins are used for detecting an ON/OFF state of each of the two signal lines. For example, the plug-insertion detection terminal 113 may be used for an insertion-detection signal line, and the image/sound standard GND terminal 108 may be used for detection. Therefore, the number of signal lines can be reduced. Here, the image/sound standard GND terminal 108 and the plug-insertion detection terminal 113 for detecting the insertion are disposed on the respective ends of the AV terminal group 107. They are disposed in this way for preventing the detection of the insertion of the plug prior to contact of the terminals other than the end terminals because, when the AV plug is inserted obliquely, the end terminals come into contact last. In addition, the plug-insertion detection terminal 113 and the image/sound standard GND terminal 108 are shorter than the AV terminals, so that they can reliably come into contact last.

Figure 8:
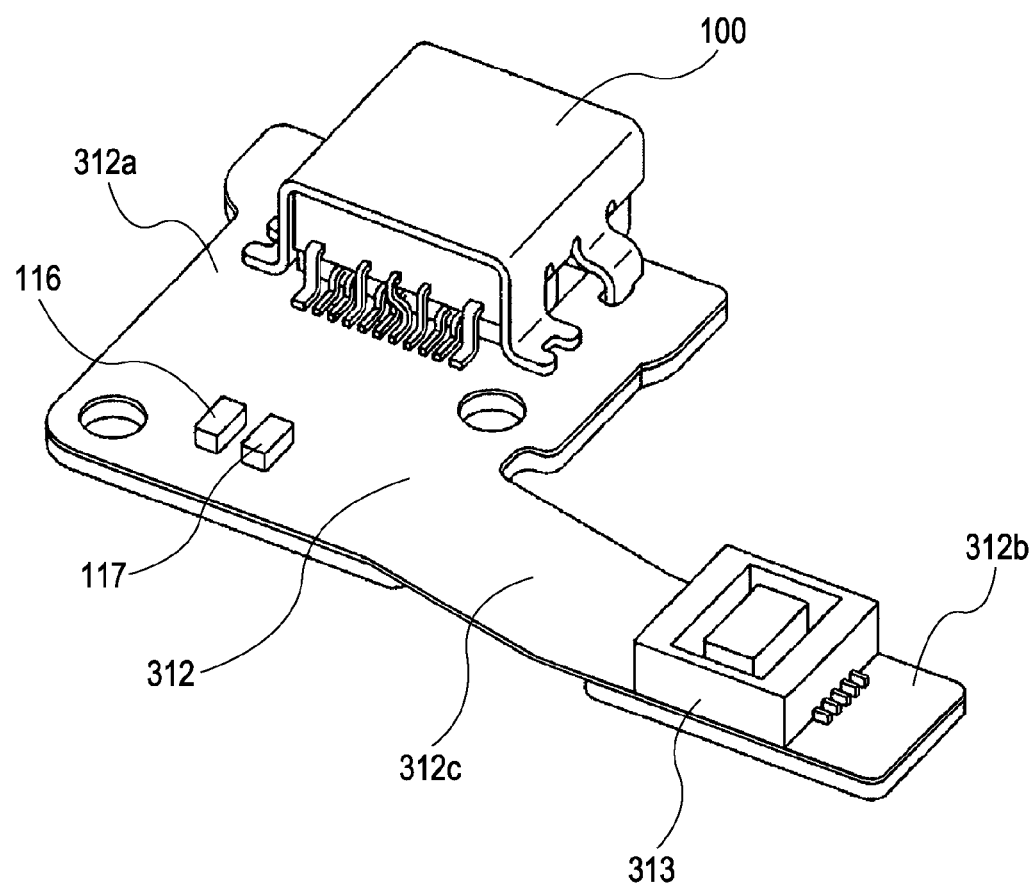
FIG. 8 is a perspective view of a jack flexible wiring board.

FIG. 8 is a perspective view of the receptacle connector 100 mounted to the jack flexible wiring board 312. The jack flexible wiring board 312 has a rigid portion 312a, to which the receptacle connector 100 is mounted, and a rigid portion 312b, to which the connector 313 is mounted. A flexible portion 312c is provided between the rigid portions 312a and 312b. The jack flexible wiring board 312 can bend at the flexible portion 312c.

Noise elements 116 and 117 are mounted to the rigid portion 312a. The jack flexible wiring board 312 connects the connector 313 and the connector 314 on the main wiring board 306 to each other. In addition, USB signals and AV signals pass through wiring patterns on the jack flexible wiring board 312 of the connected receptacle connector 100 from the respective plugs. Then, they are transmitted to an image signal processing unit, a sound signal processing unit, and the USB controlling unit on the main wiring board 306 through the connectors 313 and 314.

Figure 9:
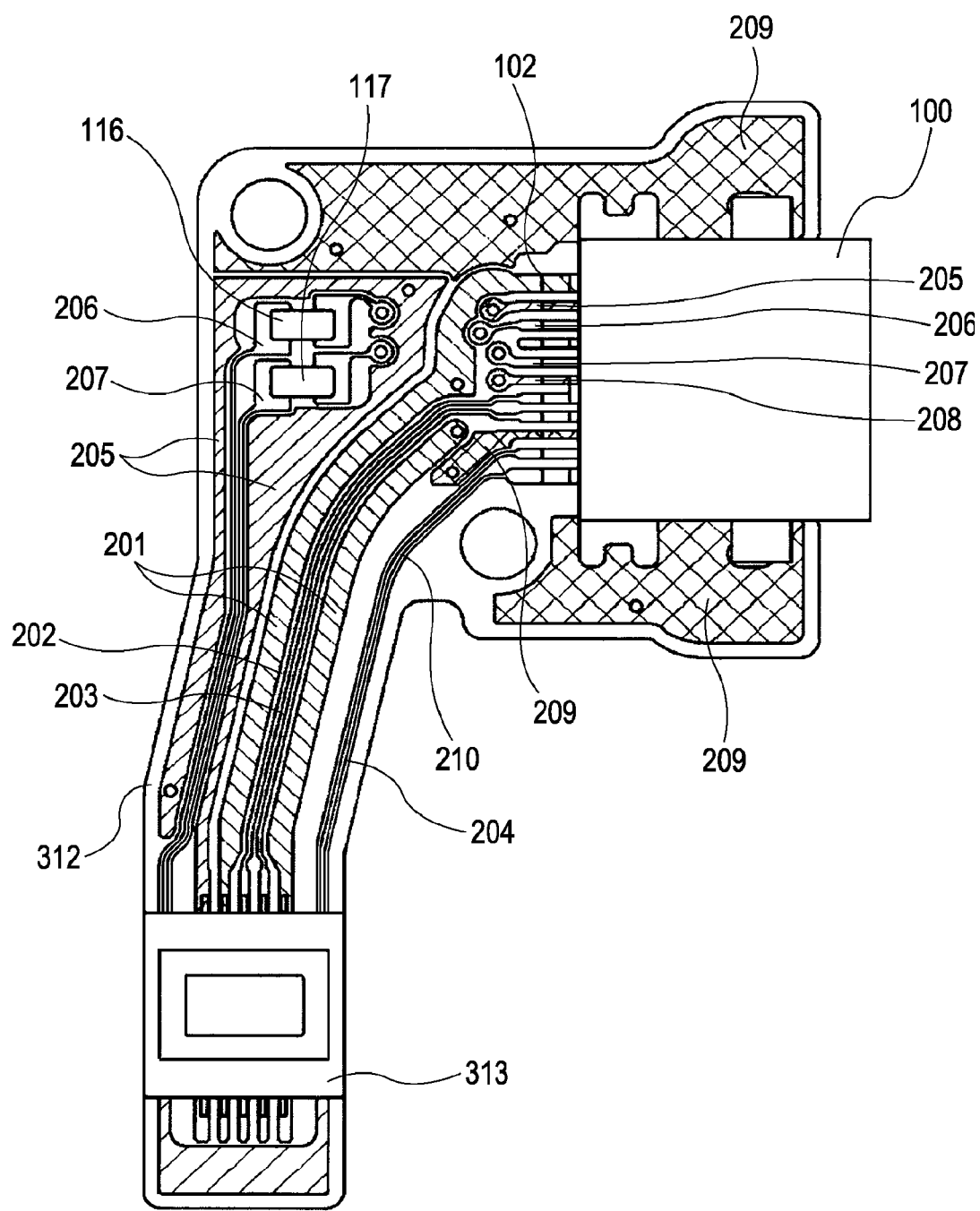
FIG. 9 shows a first layer of a wiring pattern of the jack flexible wiring board according to the first embodiment of the present invention.
Figure 10:
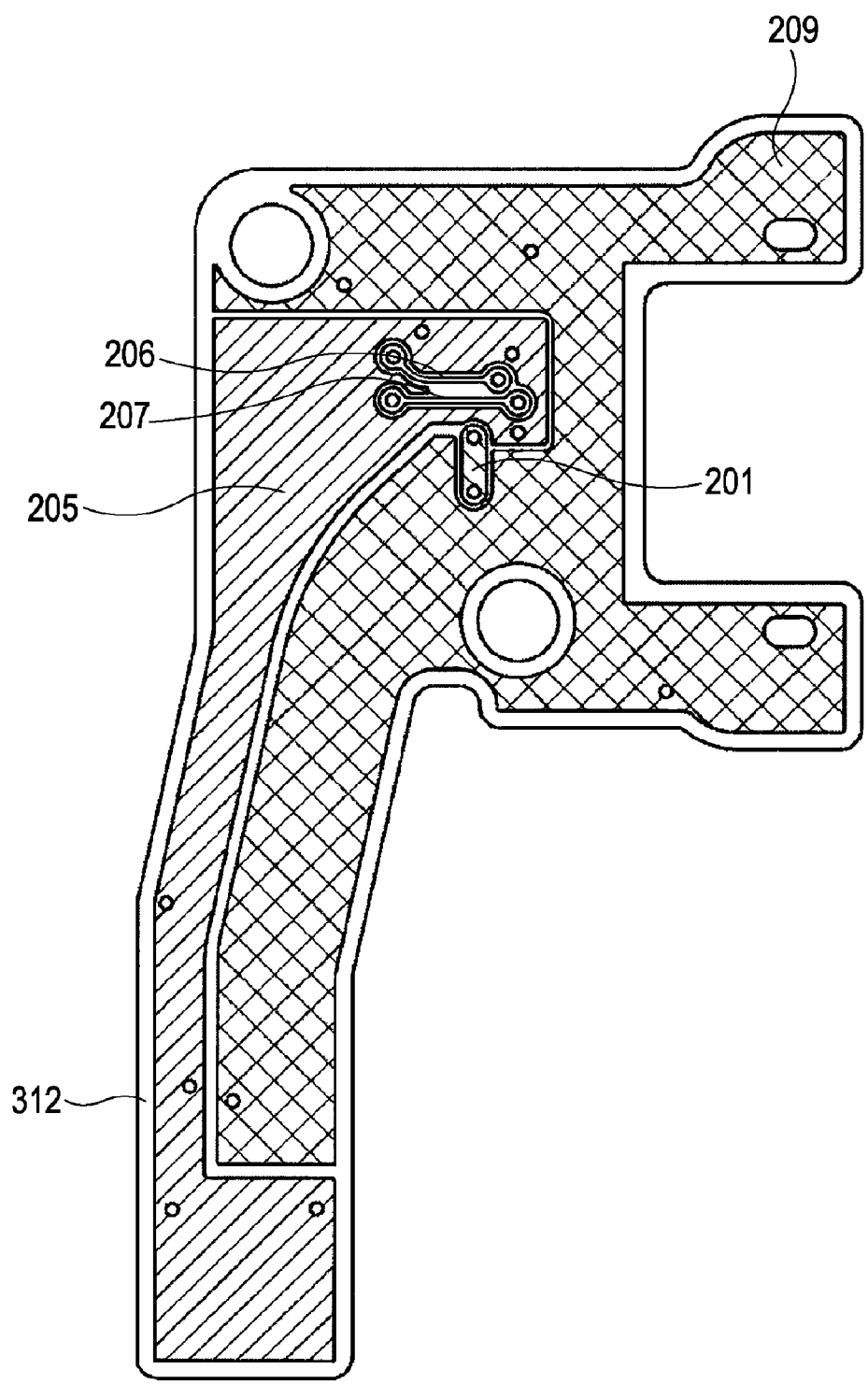
FIG. 10 shows a second layer of a wiring pattern of the jack flexible wiring board according to the first embodiment of the present invention.

The wiring patterns on the jack flexible wiring board 312 will be described in detail. FIG. 9 shows a first layer of wiring pattern on the jack flexible wiring board 312, and FIG. 10 shows a second layer of wiring pattern on the jack flexible wiring board 312.

The jack flexible wiring board 312 is a two-sided wiring board. The first layer and the second layer, positioned opposite to the first layer, are connected to each other through a via hole. Reference numeral 201 denotes a USB GND pattern (USB ground pattern). Reference numeral 202 denotes a D+ pattern. Reference numeral 203 denotes a D− pattern. Reference numeral 204 denotes a Vbus pattern. In the embodiment, the ID terminal 103 is not electrically connected to the board. Reference numeral 205 denotes an image/sound standard GND pattern (image/sound standard ground pattern). Reference numeral 206 denotes an image signal pattern. Reference numeral 207 denotes a left sound signal pattern. Reference numeral 208 denotes a right sound signal pattern. Reference numeral 209 denotes a shell GND pattern (shell ground pattern). Reference numeral 210 denotes a plug insertion detection pattern. The electrical potential of the shell GND pattern 209 is the same as that of the metallic shell of the receptacle connector 100 due to soldering.

The D+ pattern 202 pattern and the D− pattern 203, which are differential signal patterns for transmitting USB differential signals, are wired as a pair from the receptacle connector 100 to the connector 314. Respective sides of the D− pattern 202 and D+ pattern 203 are guarded by the USB GND pattern 201. In addition, the second layer is guarded by the shell GND pattern 209. Since the pins are arranged so that the D− terminal 105 is disposed adjacent to the D+ terminal 104 of the receptacle connector 100, it is possible to eliminate the influence of the other signals on the differential signals. In addition, since the D+ pattern 202 pattern and the D− pattern 203 can be wired to each other in parallel on the wiring board as they are, and can be easily wired at equal lengths, the quality of the signals is increased. The differential signals are subjected to impedance control. The differential impedance can be adjusted on the basis of a width of a wiring interval between the D+ pattern 202 pattern and the D− pattern 203, a wiring interval between the USB GND pattern 201 and the D+ pattern 202 pattern and the D− pattern 203, and an amount of overlap of the shell GND pattern 209 of the second layer and the D+ pattern 202 pattern and the D− pattern 203. The amount of overlap is adjusted by inserting a lattice or a round mesh in the shell GND pattern 209. For the GND that guards the second layer of the D+ pattern 202 and the D− pattern 203, the USB GND pattern 201 may be used.

For mounting the receptacle connector 100 and the connector 314 to the same surface, they are wired with a shortest distance therebetween without using a via hole. This makes it possible to restrict impedance mismatch.

Reference numeral 206 denotes the image signal pattern. Reference numeral 207 denotes the left sound signal pattern. The image signal pattern 206 and the left sound signal pattern 207 are wired again to the first layer after being passed through the second layer (below the USB GND pattern 201) using a via hole. Then, the noise elements 116 and 117 are connected to each other in series. In addition to preventing entry of noise through a cable from the outside of the apparatus, this prevents noise in the apparatus from being transmitted along the cable and radiated to the outside of the apparatus. When the noise element 116 is to be disposed on the wiring board, a pin arrangement in which the pins are concentrated on one side of each of the image signal terminal and the sound signal terminal makes it possible to efficiently dispose them on the wiring board.

In the embodiment, since the right sound signal pattern 208 is not used when a monaural output is performed, it is connected to the image/sound standard GND pattern 205 by a via hole. The image/sound standard GND pattern 205 and the unused right sound signal pattern 208 guard the image signal pattern 206 and the left sound signal pattern 207 at both sides thereof, and the second layer. The image/sound standard GND pattern 205, the USB GND pattern 201, and the shell GND pattern 209 are separated from each other, so that they are not influenced by signals thereof. Since the image/sound standard GND terminal 108 is disposed adjacent to the image signal terminal 109, the image signal pattern 206 can be guarded by the image/sound standard GND pattern 205 just near a mounting portion on the jack flexible wiring board 312, so that it is possible to restrict the influence of other signals thereon.

The Vbus pattern 204 and the plug insertion detection pattern 210 are wired at an end of the board where the USB signals and the AV signals are not affected.

In this way, the USB differential signal terminals, the AV image signal terminal, and the sound signal terminal are guarded by their respective GND patterns, are separated from each other, and are wired to each other. This makes it possible to maintain the quality of the signals and to restrict radiation noise.

At the jack flexible wiring board 312, the rigid portion 312a, to which the receptacle connector 100 is mounted, is disposed on the upper surface of the digital camera. The jack flexible wiring board 312 is bent into an L shape at the flexible portion 312c, and the connector 313, mounted to the rigid portion 312b, is connected to the connector 314 on the main wiring board 306 disposed at the front side of the digital camera. That is, the connector mounting surface and the main wiring board 306 are disposed so as to be orthogonal to each other. By forming the jack flexible wiring board 312 into an L shape, when the jack flexible wiring board 312, to which the receptacle connector 100 is mounted, is assembled to the electronic apparatus, the second layer of the jack flexible wiring board 312 is disposed so as to face the exterior side of the apparatus. In the second layer, the shell GND pattern 209 for guarding the USB differential signals and the image/sound standard GND pattern 205 for guarding the AV image signal and the sound signal are wired, so that it is possible to restrict radiation noise to the outside of the apparatus. In addition, by forming the jack flexible wiring board 312 into an L shape, the differential-signal D+ pattern 202 and D− pattern 203 face the inner side of the apparatus, so that it is possible to restrict radiation noise to the outside of the apparatus.

The receptacle connector 100 is pressed by the receptacle-connector securing plate 315, and is secured so as to be interposed between the receptacle-connector securing plate 315 and the metallic chassis 304. The receptacle-connector securing plate 315 contacts the receptacle connector 100, and, at the same time, is secured to the metallic chassis 304 with a screw. Since the electrical potentials of the metallic chassis 304, the shell GND pattern 209, and the metallic shell 114 of the receptacle connector are equal to each other, it is possible to restrict radiation noise. The receptacle-connector securing plate 315 is provided with an opening having a shape that is substantially the same as that of the receptacle connector 100. A vicinity thereof is covered with the receptacle-connector securing plate 315, so that it is possible to restrict radiation noise even at an insertion-opening side of the plug.

A receptacle connector according to a second embodiment of the present invention in which an arrangement of terminals of the receptacle connector is changed will be described next.

Figure 13:
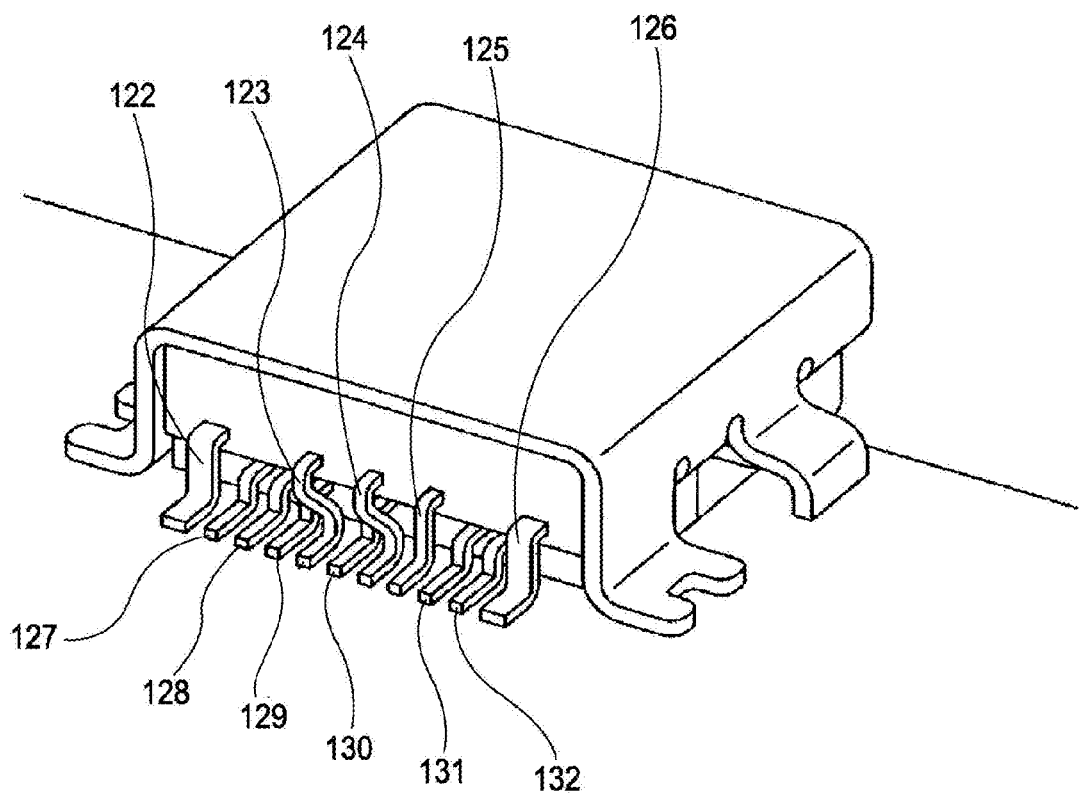
FIG. 13 is a rear perspective view of a receptacle connector according to a second embodiment of the present invention.
Figure 14:
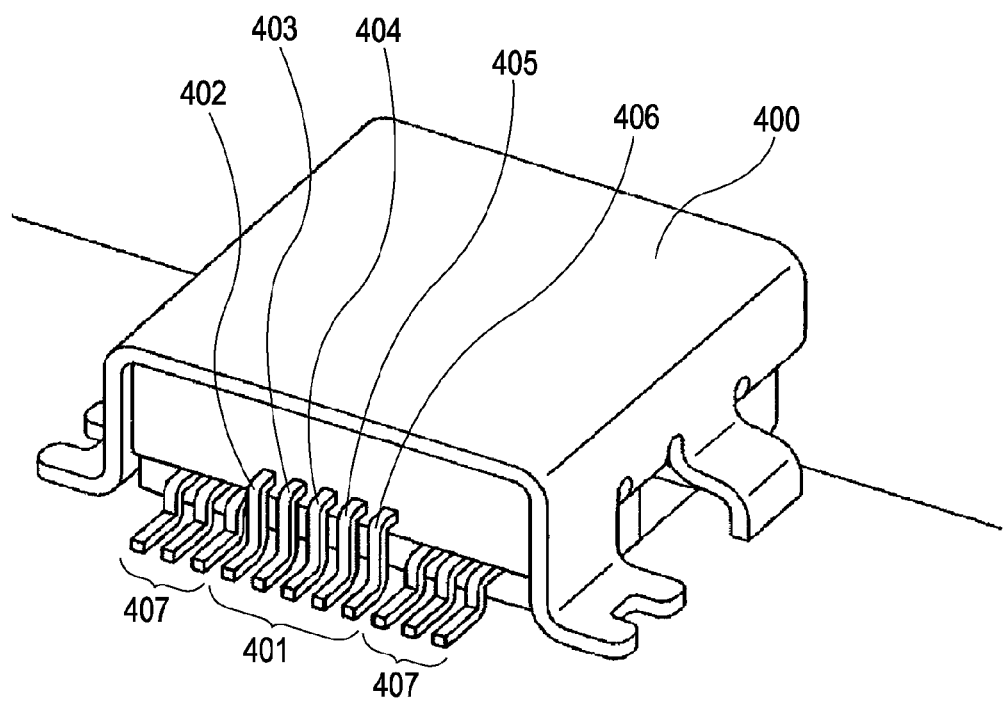
FIG. 14 is a rear perspective view of a conventional receptacle connector.
Figure 15:
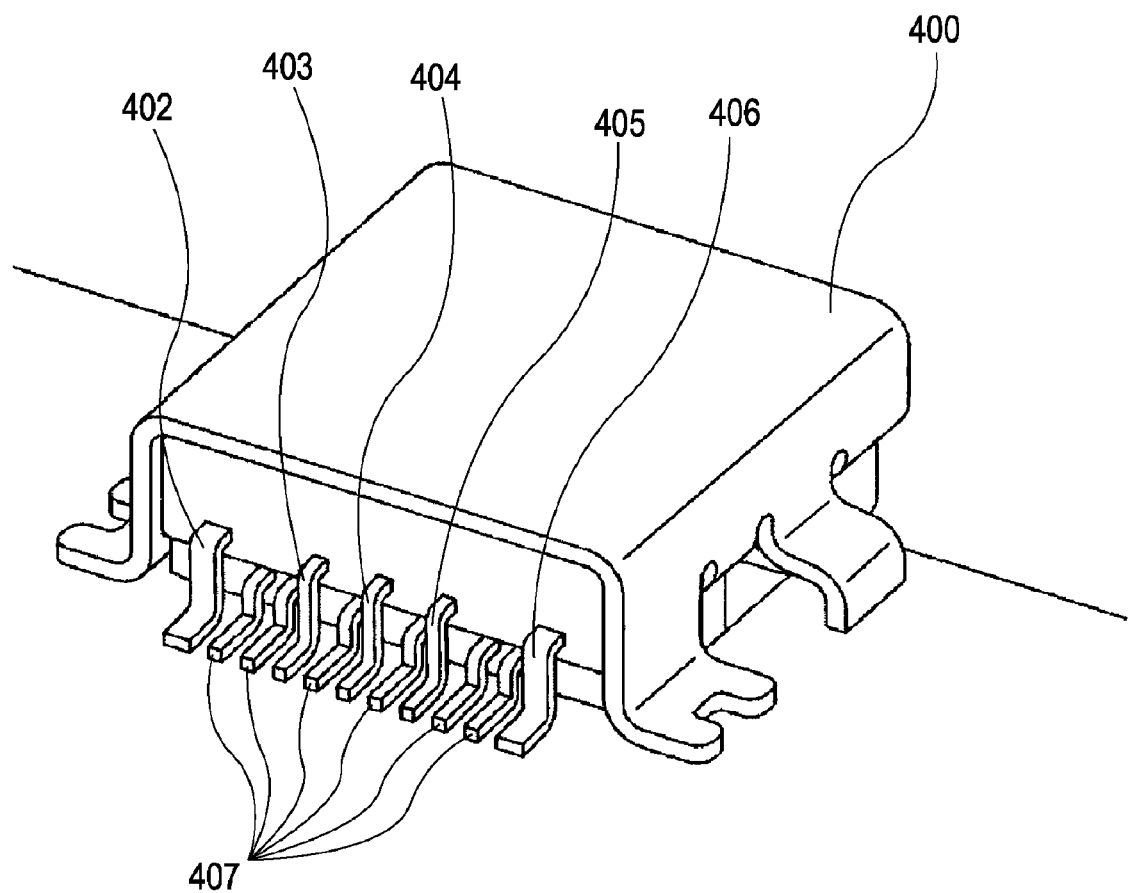
FIG. 15 is a rear perspective view of another conventional receptacle connector.

Only the differences between the receptacle connector according to the second embodiment and the receptacle connector according to the first embodiment are described. FIG. 13 is a rear perspective view of the receptacle connector according to the second embodiment of the present invention.

In the following description, reference numeral 100 denotes the second embodiment of the receptacle connector. Reference numeral 122 denotes a USB GND terminal. Reference numeral 123 denotes an ID terminal. Reference numeral 124 denotes a D+ terminal. Reference numeral 125 denotes a D− terminal. Reference numeral 126 denotes a Vbus terminal. Reference numeral 127 denotes an image/sound standard GND terminal. Reference numeral 128 denotes an image signal terminal. Reference numeral 129 denotes a left sound signal terminal. Reference numeral 130 denotes a right sound signal terminal. Reference numeral 131 denotes a shell GND terminal. Reference numeral 132 denotes a plug insertion detection terminal. When the receptacle connector 100 has this structure, signal lines of the image/sound standard GND terminal 127, the image signal terminal 128, and the left sound signal terminal 129 are disposed in parallel at a mounting portion. Therefore, when the sound is monaural and the right sound signal terminal 130 is not used, it is easier to guard an analog signal with the image/sound standard GND terminal 127, and to dispose the terminals in parallel on a jack flexible wiring board 312. This makes it possible to maintain the quality of the signals and to restrict radiation noise.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-055464 filed Mar. 5, 2008, which is hereby incorporated by reference herein in its entirety.

What is claimed is:

1. An electronic apparatus comprising:
   a composite connector including a plurality of digital signal terminals and a plurality of analog signal terminals, the plurality of digital signal terminals including at least a pair of differential signal terminals; and
   a wiring board on which the plurality of digital signal terminals and the plurality of analog signal terminals are arranged,
   wherein the plurality of analog signal terminals and the plurality of digital signal terminals are arranged and disposed in a row on the wiring board,
   wherein the plurality of analog signal terminals are not disposed between the pair of differential signal terminals, and
   wherein the plurality of analog signal terminals are disposed between the plurality of digital signal terminals other than the pair of differential signal terminals.

2. The electronic apparatus according to claim 1, wherein the analog signal terminals of the composite connector include a right sound signal terminal and a left sound signal terminal, and
   wherein the digital signal terminals are not disposed between the right sound signal terminal and the left sound signal terminal on the wiring board.

3. The electronic apparatus according to claim 1, wherein the analog signal terminals of the composite connector include a sound signal terminal and an image signal terminal, and
   wherein the digital signal terminals are not disposed between the sound signal terminal and the image signal terminal on the wiring board.

4. The electronic apparatus according to claim 1, wherein the analog signal terminals of the composite connector include a sound signal terminal and an image signal terminal, wherein the digital signal terminals of the composite connector include an ID terminal based on a universal serial bus standard, and wherein the ID terminal is disposed between the sound signal terminal and the image signal terminal on the wiring board.

5. The electronic apparatus according to claim 1, wherein the digital signal terminals of the composite connector include an ID terminal based on a universal serial bus standard, and wherein, when the electronic apparatus does not use the ID terminal, the ID terminal does not electrically connected to the wiring board.

6. The electronic apparatus according to claim 1, wherein the analog signal terminals of the composite connector include a plug-insertion detection terminal for detecting insertion or removal of a plug that is inserted into or removed from the composite connector, and wherein, among the analog signal terminals, the plug-insertion detection terminal is disposed at an outermost side.

7. The electronic apparatus according to claim 6, wherein the analog signal terminals of the composite connector include a ground terminal, wherein, among the analog signal terminals arranged in a row on the wiring board, the ground terminal is disposed at the outermost side, and wherein the insertion of the plug is detected by connecting the ground terminal and the plug-insertion detection terminal to each other.

8. The electronic apparatus according to claim 1, wherein the analog signal terminals of the composite connector include an image signal terminal and a ground terminal, and wherein the digital signal terminals are not disposed between the image signal terminal and the ground terminal on the wiring board.

9. The electronic apparatus according to claim 1, wherein the digital signal terminals of the composite connector include a universal-serial-bus ground terminal and a Vbus terminal based on a universal serial bus standard, and wherein the Vbus terminal and the universal-serial-bus ground terminal are disposed at respective ends of the plurality of digital signal terminals and the plurality of analog signal terminals.

10. The electronic apparatus according to claim 1, wherein a ground pattern of a digital signal and a ground pattern of an analog signal are separated from each other on the wiring board.

11. The electronic apparatus according to claim 1, wherein patterns, to which the pair of differential signal terminals is connected on the wiring board, are wired to each other without using a via hole.

12. The electronic apparatus according to claim 1, wherein the wiring board is a two-sided wiring board, wherein the wiring board includes a differential-signal pattern, to which the pair of differential signal terminals is connected, and a ground pattern connected to ground, wherein the ground pattern is wired to a layer opposite to a layer where the differential signal pattern is wired so as to cover the differential signal pattern, and wherein the wiring board is disposed so that the ground pattern is positioned at an exterior side of the electronic apparatus.

13. A composite connector mounted to a wiring board, the composite connector comprising:

a plurality of analog signal terminals connected to the wiring board; and a plurality of digital signal terminals connected to the wiring board, the plurality of digital signal terminals including at least a pair of differential signal terminals, wherein the plurality of analog signal terminals and the plurality of digital signal terminals are arranged and disposed in a row on the wiring board, wherein the plurality of analog signal terminals are not disposed between the pair of differential signal terminals, and wherein the plurality of analog signal terminals are disposed between the plurality of digital signal terminals other than the pair of differential signal terminals.

14. The composite connector according to claim 13, wherein the analog signal terminals of the composite connector include a right sound signal terminal and a left sound signal terminal, and wherein the digital signal terminals are not disposed between the right sound signal terminal and the left sound signal terminal.

15. The composite connector according to claim 13, wherein the analog signal terminals of the composite connector include a sound signal terminal and an image signal terminal, and wherein the digital signal terminals are not disposed between the sound signal terminal and the image signal terminal.

16. The composite connector according to claim 13, wherein the analog signal terminals of the composite connector include a sound signal terminal and an image signal terminal, wherein the digital signal terminals of the composite connector include an ID terminal based on a universal serial bus standard, and wherein the ID terminal is disposed between the sound signal terminal and the image signal terminal.

17. The composite connector according to claim 13, wherein the analog signal terminals of the composite connector include a plug-insertion detection terminal for detecting insertion or removal of a plug that is inserted into or removed from the composite connector, and wherein, among the analog signal terminals, the plug-insertion detection terminal is disposed at an outermost side.

18. The composite connector according to claim 17, wherein the analog signal terminals of the composite connector include a ground terminal, wherein, among the analog signal terminals, the ground terminal is disposed at the outermost side, and wherein the insertion of the plug is detected by connecting the ground terminal and the plug-insertion detection terminal to each other.

19. The composite connector according to claim 13, wherein the analog signal terminals of the composite connector include an image signal terminal and a ground terminal, and wherein the digital signal terminals are not disposed between the image signal terminal and the ground terminal on the wiring board.

20. The composite connector according to claim 13, wherein the digital signal terminals of the composite connector include a universal-serial-bus ground terminal and a Vbus terminal based on a universal serial bus standard, and wherein the Vbus terminal and the universal-serial-bus ground terminal are disposed at respective ends of the plurality of digital signal terminals and the plurality of analog signal terminals.

* * * * *